(12) United States Patent
Martinsen et al.

(10) Patent No.: US 11,525,180 B2
(45) Date of Patent: *Dec. 13, 2022

(54) TRANSPARENT PHOTOCHROMIC DEVICE

(71) Applicant: Institutt for Energiteknikk, Kjeller (NO)

(72) Inventors: Fredrik Aleksander Martinsen, Oslo (NO); José Montero Amenedo, La Bañeza (ES); Smagul Karazhanov, Oslo (NO); Trygve Tveiterås Mongstad, Oslo (NO); Erik Stensrud Marstein, Skedsmokorset (NO)

(73) Assignee: Institutt for Energiteknikk, Kjeller (NO)

( * ) Notice: Subject to any disclaimer, the term of this patent is extended or adjusted under 35 U.S.C. 154(b) by 196 days.

This patent is subject to a terminal disclaimer.

(21) Appl. No.: 16/067,746

(22) PCT Filed: Jan. 20, 2017

(86) PCT No.: PCT/EP2017/051228
§ 371 (c)(1),
(2) Date: Jul. 2, 2018

(87) PCT Pub. No.: WO2017/125573
PCT Pub. Date: Jul. 27, 2017

(65) Prior Publication Data
US 2019/0002340 A1 Jan. 3, 2019

(30) Foreign Application Priority Data

Jan. 21, 2016 (NO) .................................. 20160106

(51) Int. Cl.
*C23C 14/06* (2006.01)
*C23C 14/08* (2006.01)
(Continued)

(52) U.S. Cl.
CPC ................ *C23C 14/06* (2013.01); *C03C 4/06* (2013.01); *C03C 17/3429* (2013.01);
(Continued)

(58) Field of Classification Search
CPC . C03C 17/22; C03C 17/3429; C03C 17/3435; C03C 4/06; C03C 2217/28;
(Continued)

(56) References Cited

U.S. PATENT DOCUMENTS 5,976,717 A  11/1999 Holdik et al.
6,175,450 B1  1/2001 Andreani et al.
(Continued)

FOREIGN PATENT DOCUMENTS

JP  S58034437 A  2/1983
JP  H10-503858 A  4/1998
(Continued)

OTHER PUBLICATIONS

Deckwerth, Martin, "International Search Report," prepared for PCT/EP2017/051228, dated Mar. 28, 2017, four pages.
(Continued)

*Primary Examiner* — Michael A Band
(74) *Attorney, Agent, or Firm* — Shackelford, Bowen, McKinley & Norton, LLP

(57) ABSTRACT

The present invention relates to a metal hydride device having a variable transparency, comprising a substrate, at least one layer including a photochromic yttrium hydride having a chosen band gap, and a capping layer at least partially positioned on the opposite side of the photochromic yttrium hydride layer from the substrate, said capping layer being essentially impermeable to hydrogen and oxygen.

11 Claims, 1 Drawing Sheet

(51) Int. Cl.
*C03C 17/34* (2006.01)
*C03C 4/06* (2006.01)
*E06B 9/24* (2006.01)
*G02B 5/23* (2006.01)
*G02F 1/01* (2006.01)

(52) U.S. Cl.
CPC ........ *C03C 17/3435* (2013.01); *C23C 14/083* (2013.01); *E06B 9/24* (2013.01); *G02B 5/23* (2013.01); *G02F 1/0126* (2013.01); *C03C 2217/28* (2013.01); *C03C 2217/475* (2013.01); *C03C 2217/48* (2013.01); *C03C 2217/73* (2013.01); *C03C 2218/155* (2013.01); *E06B 2009/2417* (2013.01); *G02F 2201/50* (2013.01); *G02F 2201/501* (2013.01); *G02F 2202/14* (2013.01)

(58) Field of Classification Search
CPC .......... C03C 2217/475; C03C 2217/48; C03C 2217/73; C03C 2218/155; G02B 5/23; G02F 1/0126; G02F 2201/50; G02F 2201/501; G02F 2202/14; E06B 9/24; E06B 2009/2417; C23C 14/06; C23C 14/083
See application file for complete search history.

(56) References Cited

U.S. PATENT DOCUMENTS

| | | | |
|---|---|---|---|
| 6,586,102 | B1 | 7/2003 | Stachowiak |
| 9,099,673 | B2* | 8/2015 | Tchakarov .......... C03C 17/3626 |
| 9,864,118 | B2* | 1/2018 | Soon ........................ G02B 5/23 |
| 2005/0206990 | A1 | 9/2005 | Yoshimura et al. |
| 2006/0105134 | A1 | 5/2006 | LeBlanc et al. |
| 2011/0048970 | A1 | 3/2011 | Sugaya et al. |
| 2016/0202402 | A1 | 7/2016 | Soon et al. |
| 2019/0169493 | A1* | 6/2019 | Martinsen .............. C03C 17/22 |

FOREIGN PATENT DOCUMENTS

| | | |
|---|---|---|
| JP | 2004-279680 A | 10/2004 |
| JP | 2013-109254 A | 6/2013 |
| JP | 2013-205559 A | 10/2013 |
| JP | 2018538776 A | 12/2018 |
| RU | 101971 U1 | 2/2011 |
| WO | WO-9841901 A1 | 9/1998 |
| WO | WO-2016109651 A1 | 7/2016 |
| WO | WO-2017125573 A1 | 7/2017 |

OTHER PUBLICATIONS

Mongstad, T., et al., "A New Thin Film Photochromic Material: Oxygen-Containing Yttrium Hydride," Solar Energy Materials and Solar Cells, vol. 95, No. 12, Aug. 23, 2011, pp. 3596-3599.

Mongstad, T., et al., "Transparent Yttrium Hydride Thin Films Prepared by Reactive Sputtering," Journal of Alloys and Compounds, 2011, pp. S812-S816.

You, C. C., et al., "Engineering of the Band Gap and Optical Properties of Thin Films of Yttrium Hydride," Applied Physics Letters, vol. 105, No. 3, Jul. 21, 2014, pp. 031910-1-031910-4.

Van Gogh, A.T.M., et al., "Structural, Electrical, and Optical Properties of $La_1$-$YH_x$ Switchable Mirrors," Physical Review B, vol. 63, 2001, pp. 195105-1-195105-21.

Serra, E., et al., "Hydrogen Permeation Measurements on Alumina," Journal of the American Ceramic Society, vol. 88, Issue 1, 2005, pp. 15-18.

Baldé, Kaisa, "International Search Report," prepared for PCT/EP2017/064680, dated Oct. 6, 2017, four pages.

You, Chang Chuan, et al., "Dynamic Reactive Sputtering of Photochromic Yttrium Hydride Thin Films," Solar Energy Materials and Solar Cells, vol. 143, Sep. 23, 2014, pp. 623-626.

Mongstad, Trygve, et al., "Surface Oxide on Thin Films of Yttrium Hydride Studied by Neutron Reflectometry," Applied Physics Letters, vol. 100, 191604, May 10, 2012, pp. 191604-1 to 191604-3.

Huiberts, J. N., et al., "Yttrium and Lanthanum Hydride Films with Switchable Optical Properties," Nature, vol. 380, Mar. 21, 1996, pp. 231-234.

Pishtshev, Aleksandr, et al., "Role of Oxygen in Materials Properties of Yttrium Hydride," Solid State Communications, 194 (2014), pp. 39-42.

Mongstad, Trygve Tveiteras., Thin-film Metal Hydrides for Solar Energy Applications, 2012, University of Oslo, all pages (Year: 2012).

Van Der Molen et al., Insulating fcc YH3 Stabilized by MgH2, 2001, Physical Review B, 63, 1-8 (Year: 2001).

Mongstad, T., et al.; "The electronic state of thin films of yttrium, yttrium hydrides and yttrium oxide"; Solar Energy Materials & Solar Cells; 2014; 5 pages; http://dx.doi.org/10.1016/j.solmat.2014.05.037.

* cited by examiner

TRANSPARENT PHOTOCHROMIC DEVICE

The present invention relates to a photochromic device, especially a photochromic transparent device like a window.

The smart window market today is at the present largely dominated by technologies that utilize electricity to control the transparency of the windows. These kind of windows can be achieved utilizing various technologies, e.g. electrochromic technologies or dispersed particle alignment methods, both having achieved the status of highly mature technologies with a high functionality in the field. However, common for all electricity-based technologies is that they depend on complex multilayer structures to function that significantly add complexity to the fabrication procedure and further to the price of the windows. Although such windows have a great advantage due to the freedom they give the user in controlling the transparency personally, they entail large installation and maintenance costs as wiring and control systems must be installed. Comparatively, smart windows based on photochromic materials avoid all these mentioned problems as the photochromic component itself is simple in design and because it is passive in the sense that its transparency is determined only by the outdoor illumination without any interference by the user. Such windows can thus be installed without any additional costs compared with normal windows, and they can be fabricated to suit the conditions experienced by the user, determined for example by the climate and latitude at the location where the windows are being installed.

Several photochromic materials have been known for many years, most of which are of organic origin. Examples of such are stilbens, nitrones, fulgides and spiropyrans which all undergo a chemical change upon illumination with light, a change that reverses when the illumination is removed. Such chemical changes vary from material to material and could for example be a cis-trans isomerization or a change in oxidation state, but common for all these reactions is that they result in an increased absorption of light within the visible light spectrum. Organic photochromic materials have for this reason seen several applications, with perhaps the most commonly known being the photochromic glasses that are commercially available today. Although highly functional, all organic photochromic materials suffer from reliance on complex fabrication methods that limit scalability, and they all suffer from fatigue, meaning a degradation of the organic material either caused by illumination or by age. As photochromic materials are a desired component in large scale commercial windows as a way of adjusting indoor illumination it is of interest to look for alternative materials with higher fatigue resistance that can more easily be fabricated on large scales.

Due to the degradation problems experienced with organic photochromic materials, it is of interest to develop non-degradable inorganic materials that possess photochromic properties. Thus it has been an object of the present invention to provide a stable photochromic device that can be used in windows and similar. This is obtained as described in the accompanying claims.

The invention thus relates to the field of inorganic glass coatings whose purpose is to adjust the transparency of the glass through a reversible reaction with light. The photochromic material in this invention is a specially prepared inorganic hydride, which does not degrade in the same way as photochromic organic materials, making it a good candidate for retaining photochromic properties over time and upon prolonged illumination periods.

One already known inorganic glass coating material is oxygen-containing yttrium hydride deposited using reactive sputtering. Photochromic yttrium hydride was first prepared through hydrogenation of small amounts of metallic yttrium under high pressures in diamond anvils, but due to the limitations in the quantity output as well as limited photochromic behavior, this fabrication method has never been considered for large scale production. Photochromic yttrium hydride was later prepared through reactive sputtering, but here in the form of oxygen-containing yttrium hydride, where the photochromic behavior has been accredited to the incorporation of oxygen during production. Although photochromic with a dynamic contrast of around 40% absolute—meaning a 40% lower transmittance in the photodarkened state compared to the non-photodarkened state—the production method for these oxygen-containing yttrium hydride (YH:O) films suffers from the limitation on quantity output caused by inhomogeneities in the fabricated films. Large scale homogeneous films of YH:O have later been prepared by the same method but now with a much lower dynamic contrast, measuring only around 20%, and without any control of the obtainable degree of photodarkening. Dynamic contrast is in this case defined as the difference in transmittance between the clear and the photodarkened state of the photochromic material. Common for previously reported photochromic YH:O films is that they all degrade upon prolonged storage in air as well as prolonged illumination (T. Mongstad et al., Solar Energy materials and Solar Cells 95 (2011) 3596-3599, "A new thin film photochromic material: Oxygen-containing yttrium hydride"). According to the present invention this is improved by applying a transparent capping layer on top of the YH:O, which maintains the hydrogen concentration within the material as well as protects it against oxidation over time.

The invention will be described more in detail below with reference to the accompanying drawings, illustrating the invention by way of examples.

Figure 1:
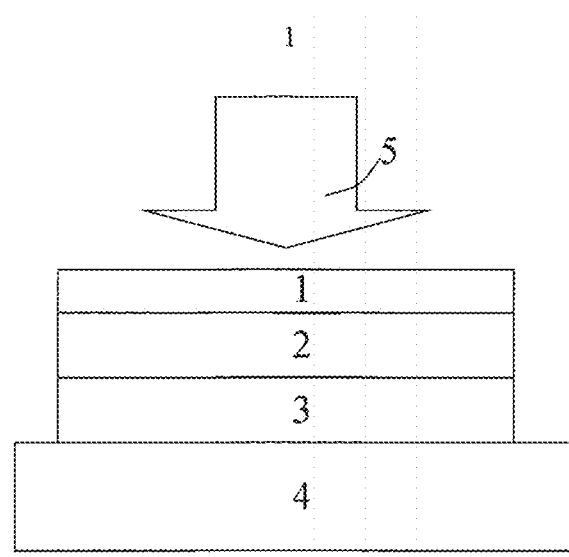
FIG. 1 illustrates a possible layered structure constituting the preferred embodiment of the invention.

The current invention concerns a way of producing highly photochromic stable yttrium hydride thin films in a scalable manner through methods of physical vapour deposition. By controlling the hydrogen and oxygen incorporated into the material, the transparency, conductivity and the degree of photodarkening can be controlled, leaving the fabrication procedure capable of producing large scale homogeneous photochromic thin films with tailored properties for a wide range of applications. The said thin films are further protected from deterioration due to hydrogen escaping the film or due to prolonged reactions with for example the ambient through covering of these with a non-reactive, transparent material, e.g. an oxide or a nitride, causing them to remain long time chemically stable.

More specific the capping layer is meant to maintain a stable hydrogen and oxygen concentration inside the photochromic layer, keeping them essentially unaltered throughout the lifetime of the desired application: a window.

When writing essentially unaltered, it is meant that the concentration should stay sufficiently constant as to not affect the physical properties of the material upon prolonged times. Some dissipation can and will occur as no material with perfect impermeability exists.

Permeability is a measure of how much and how fast a substance can diffuse though another. Considering a flat slab with cross sectional area A and thickness L the permeability is defined through the following equation $$\frac{dv}{dt} = \frac{K*A}{L}(PH^{0.5} - PL^{0.5})$$

where dv/dt is the gas flow through the slab, K is the permeability and PH-PL is the pressure difference across the slab.

Now assume a 1 m², 1000 nm thick YH:O film covered by a 1 m², 100 nm thick slab (capping layer) like the one described above. Using the permeability value for polycrystalline alumina glass at room temperature, $9.3*10^{-28}$ mol/Pa*m*s (J. Am. Ceram. Soc., 88 [1] 15-18 (2005)), and PH-PL=1 atm, we find through using the above equation that the flow of hydrogen though the slab is $1.22*10^{-18}$ mol per second. With the total amount of hydrogen in a 1 m², 1000 nm thick film of YH:O measuring around 0.042 mol, we need to wait $1.1*10^9$ years for all the hydrogen to dissipate. If the threshold for significant dissipation of the total hydrogen content is set to 1%, this threshold will be reached after $1.1*10^7$ years. As this is orders of magnitude longer than any window will be required to last we therefore term alumina as a material that is essentially impermeable to hydrogen.

Note that the value for PH-PL in this case is set to 1 atm. Although this value can be largely considered as an exaggeration, we can see from eq. (1) that PH-PL scales linearly with dv/dt, and hence can many times higher without affecting the result in any significant manner.

As is disclosed in the articles Chang Chuan You, Applied Physics Letters 105, 031910 (2014), "Engineering of the band gap and optical properties of thin films of yttrium hydride" and T. Mongstad et al., Solar Energy materials and Solar Cells 95 (2011) 3596-3599, "A new thin film photochromic material: Oxygen-containing yttrium hydride" it is known that the optical properties of Yttrium Hydride may change with the hydrogen content of the material. However, as stated in the latter publication the mechanisms of the photochromism was unresolved. The further discussion leads to a conclusion that the oxygen content of the material is important for the photochromism.

In the article T. Mongstad et al, Journal of Alloys and Compounds 509S (2011) S812-S816, "Transparent yttrium hydride thin films prepared by reactive sputtering." A layered structure including a transparent, semiconducting yttrium hydride layer is discussed. In this case a 150 nm thick molybdenum capping layer is used to avoid hydrogen diffusing out of yttrium hydride, which would make it non-transparent. As the Molybdenum capping layer was not transparent the structure was not suitable for windows, and also, the aim was the use of the Yttrium Hydride for solar cells, and thus a photochromic effect was not wanted. In general and regardless of its hydrogen permeability, any metal coating thicker than 10 nm nanometers, would be unsuited for a photochromic window due to its low transmittance in the visible and UV light spectrum. Any photochromic window is required to have a non-zero visual transparency in its clear state, preferably larger than 50%.

More specifically the invention is illustrated in FIG. 1 illustrating the cross section of a photochromic window according to the invention where light 5 propagated toward the window. The window is constituted by a first capping layer 1, a photochromic layer 2, a second capping layer 3 and the substrate 4. The capping layers 1,3 are impenetrable to hydrogen and oxygen, thus maintaining the hydrogen content as well as oxygen content present in the photochromic layer 2. The amount of light passing through the window will then depend on the light intensity and the photochromic effect.

More in detail the photochromic layer 2 may be a continuous layer or consist of particles of photochromic material in a carrier material, depending on the intended effect and the properties of the photochromic material. In addition the magnitude of the photochromic effect may be chosen both by adjusting the properties of the material and/or by varying the concentration of the photochromic particles. The carrier material may be comprised off, but is not limited to, for example plastics, polymers, oxides or nitrides.

The presence of the capping layers 1,3 is important in order to stabilize the photochromic material. Although it could be contemplated that they may be constituted by the upper part of the photochromic layer such layers have a tendency to degrade over time and should be combined with additional layers such as the substrate layer 4, e.g. by choosing a substrate material being essentially impermeable to hydrogen and oxygen both as single atoms and in molecules.

In the preferred embodiment of the present invention, the combined role of hydrogen and oxygen on the optical and photochromic properties of sputter deposited yttrium hydride, constituting the photochromic layer 2, is utilized. Properties like transparency, conductivity and the degree of photodarkening, can be controlled by controlling the hydrogen and oxygen content.

Figure 2:
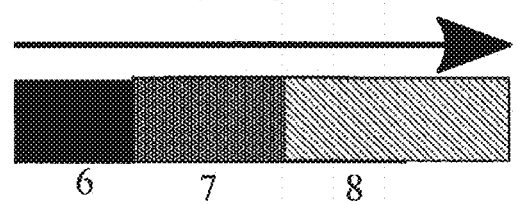
FIG. 2 illustrates the relationship between hydrogen content in the material, and its visual appearance.

Sputter deposition of yttrium hydride with a very low or non-existing hydrogen content, result in metallic yttrium films which are consequently fully opaque. Through carefully increasing the hydrogen content in the films, as illustrated in FIG. 2, one eventually reaches a critical concentration where the material goes from being metallic opaque 6 to being dark frosted opaque 7, before it for even higher hydrogen content reaches a second critical concentration which permits the material to transform into becoming yellow/orange transparent 8.

Specifically, yttrium hydride is known be in a dark state if the hydrogen concentration is about 2 H per Y or lower, although the exact number is not known. If the hydrogen content is reduced the yttrium hydride will exist as an understoichiometric yttrium-hydride or as a mix of an yttrium hydride and metallic yttrium.

At higher concentrations of H per Y the yttrium hydride can turn transparent. The exact amount will depend on the method of fabrication, chosen substrate and number of defects, and is therefore not specified here. In addition, the transparency will depend on the occurrence of other contaminations in the material. At the present there is a practical limit at more than 3 H per Y, and thus the practical area is below 3 H per Y.

In order to maintain the photochromic effect, the material should have a band gap of at least 1 eV, and preferably less than 4 eV in the initial state, i.e. without illumination. More preferably the band gap should be between 2 eV and 3.5 eV or ideally between 2.5 eV and 3.2 eV.

Large scale homogeneous yttrium hydride films with tunable transparency, conductivity and degree of photochromic dynamic contrast can be fabricated via reactive sputtering.

The substrate 4—being the material on which the film is being grown—is kept in motion in front of the plasma plume in order to obtain an even film thickness across the substrate.

The preferred type of motion one should apply to the substrate will depend on the nature of the sputtering system, but where the goal always is to achieve a homogeneous thickness across the substrate. The motion must in any case be sufficiently fast in order to avoid any inhomogeneities with respect to chemical composition caused by geometric factors that are known to occur with reactive sputtering. The latter is also important in order to maintain evenly distributed stress in the film, minimizing crack formation and delamination.

The yttrium hydride films described above are typically made with a thickness measuring ~100 nm but can exist in thicker or thinner forms dependent on the application for which they are intended. A typical thickness of an yttrium hydride film is 200 nm-1500 nm, and is ideally between 500 nm and 1200 nm. The films can be deposited on a wide range of substrates 4, with various transparent glass or polymer substrates being of the highest interest due to applications within the window industry.

Yttrium hydride is known to be highly susceptible to oxidation due to the low electronegativity of yttrium. An unprotected film will thus by exposure to air over time, continuously react with oxygen and water vapor, which do not only alter the chemical composition and hence physical properties of the material, but also cause increased stress levels in the films making them more susceptible to cracking followed by potential delamination over time. A solution to this problem has been developed by the inventors, where referring again to FIG. 1 a transparent non-reactive coating 1 is deposited on top of the yttrium hydride film 2 with a limited exposure to oxygen in or after the depositing process. This coating or capping layer 1 can consist of any material, e.g. oxides, nitrides, oxyhydrides etc., as long as it is largely transparent to the visible light spectrum (and to UV radiation with energy larger than the bandgap of the photochromic layer), non-reactive towards the yttrium hydride as well as air, and that it provides a strong diffusion barrier for oxygen and water. Failing to fulfil the last criterion would lead to oxygen from the ambient diffusing in through the coating over time, causing oxidation and hence degradation of the yttrium hydride. Examples of capping materials are transition metal oxides and nitrides, alkaline oxides and nitrides and rare earth oxides or nitrides. Specific examples are silicon oxide, titanium oxide, yttrium oxide aluminum oxide, silicon nitride and aluminum nitride. The capping layer could also be of organic nature, for example a polymer or plastic.

The above mention coating will in addition to acting as a diffusion barrier to oxygen also act as a diffusion barrier to hydrogen diffusion out of the underlying hydride. Experimental data shows that the hydrogen escapes the material when exposed to air as well as when being subject to ionic radiation. As the properties of the hydride are depending on the concentration of hydrogen, it is important to maintain a stable hydrogen concentration as a function of time and use. The coating or capping layer 1 will thus stabilize the hydride, hindering hydrogen from diffusing out from the photochromic layer 2 at for example elevated temperatures. As mentioned above a similar coating or capping layer 3 may be present between the substrate 4 and the photochromic layer 2, or the substrate may itself hinder hydrogen from diffusing from the photochromic layer.

Figure 3:
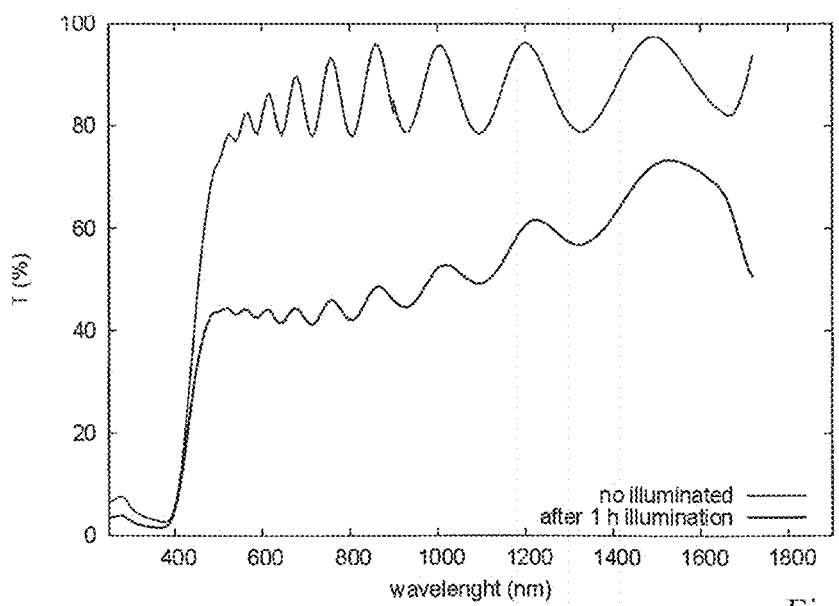
FIG. 3 illustrates the transmission through a window according to the invention.

FIG. 3 illustrates the transmission through a window according to the invention where the upper curve indicates the transmission without illumination and the lower curve after one hour of illumination.

To summarize the invention relates to a metal hydride device having a variable transparency, comprising a substrate, and at least one layer including an yttrium hydride having a chosen band gap. As discussed above the yttrium hydride layer may be a continuous layer or a layer including particles or segments of yttrium hydride.

A capping layer, preferably constituted by, but not limited to, an oxide or nitride layer, is positioned at least partially on the opposite side of the photochromic layer from the substrate, being essentially impermeable to hydrogen and preferably also to oxygen, both as single atoms and in molecular form, and water. The capping layer should preferably also act as a diffusion barrier to all reactive gasses. By adjusting the thickness in a per se known way it may also serve as an anti-reflection coating, also enabling the possibility of adjusting the color of the window.

In the embodiment where the yttrium hydride layer consists of segments or particles they may be distributed in the capping layer, which both includes the metal hydride and covers the segments or particles, acting like a barrier.

According to one embodiment of the invention, the capping layer may be produced by exposing the yttrium hydride layer to oxygen, which may create an oxide layer due to the reaction between the yttrium hydride and oxygen.

The substrate may include a similar capping layer or be made from a material having essentially the same characteristics in terms of being essentially impermeable to hydrogen, preferably also is impermeable to oxygen and water, as well as act as a diffusion barrier to reactive gases.

In addition to the capping, yttrium hydride and substrate, any number of transparent or partially transparent layers between layers or on top of or under the device may be added for optical or design purposes. These layers can consist of, but are not limited to, any transparent material, gas, fluid or vacuum.

The yttrium hydride preferably has photochromic properties thus being darkened when subject to illumination and has a band gap being above 1 eV in un-illuminated conditions, and preferably less than 4 eV. More preferably the band gap should be between 2 eV and 3.5 eV or ideally between 2.5 eV and 3.2 eV.

As stated above, the hydrogen concentration may be up to 3 H per Y. More preferably the hydrogen content should be between 0.5 and 2 H per Y or ideally between 0.7 and 1.5 H per Y. The transparency, conductivity and/or degree of photo darkening of at least one layer of yttrium hydride are provided by a chosen concentration of hydrogen and oxygen.

Alternatively or in combination, the wanted transparency, conductivity and/or degree of photodarkening of the yttrium hydride is obtained by controlling the concentration of oxygen in addition to the concentration of hydrogen incorporated during the production. The average oxygen concentration in the layer may vary within the range between 0 and 65 atomic percent, it is preferably less than 50 atomic percent (% at), and is especially approximately 30 atomic percent.

The yttrium hydride may also be doped with any number of elements, such as various lanthanides or alkaline earth metal having a concentration smaller than the concentration of yttrium. Examples of such elements are Lanthanum, Erbium, Magnesium, Calcium and Strontium.

As mentioned above the method for producing a device according to the invention will preferably include the step of using a physical vapour deposition technique to fabricate a yttrium hydride on a hydrogen impermeable substrate, where the yttrium hydride has a chosen concentration of hydrogen and oxygen. After this step a material being impermeable to hydrogen and preferable also oxygen is deposited, providing a capping layer on top of said yttrium hydride layer. Intermediate steps, e.g. providing additional layers such as a capping layer on the substrate in case the substrate is permeable to hydrogen, may also be applied.

The invention claimed is:

1. A method for producing a transparent photochromic metal hydride device, the method comprising:
   using reactive sputtering to fabricate at least one photochromic yttrium hydride layer;
   incorporating oxygen into the at least one photochromic yttrium hydride layer;
   depositing a transparent capping layer on top of the at least one photochromic yttrium hydride layer;
   wherein the transparent photochromic metal hydride device comprises an essentially-hydrogen-impermeable transparent substrate, the at least one photochromic yttrium hydride layer, and the transparent capping layer, the at least one photochromic yttrium hydride layer having a band gap in the range from 1 eV to 4 eV without illumination, and the transparent capping layer at least partially positioned on an opposite side of the at least one photochromic yttrium hydride layer from the essentially-hydrogen-impermeable transparent substrate, the transparent capping layer being impermeable to hydrogen so as to maintain a concentration of hydrogen in the at least one photochromic yttrium hydride layer;
   wherein the thickness of the at least one photochromic yttrium hydride layer is in a range of 100-1500 nm;
   wherein the essentially-hydrogen-impermeable transparent substrate is a glass or polymer substrate;
   wherein the at least one photochromic yttrium hydride layer has an average oxygen concentration of approximately 30% to 65 at %;
   wherein the at least one photochromic yttrium hydride layer has a hydrogen concentration between 2 and 3 H per Y on the essentially-hydrogen-impermeable transparent substrate;
   wherein the transparent capping layer comprises at least one of a transition metal oxide, transition metal nitride, alkaline oxide, alkaline nitride, rare earth oxide, rare earth nitride, polymer and plastic; and
   wherein the transparent photochromic metal hydride device has a visual transparency in a clear state of greater than 50%.

2. The method according to claim 1, wherein at least one of transparency, conductivity, and degree of photodarkening of the at least one photochromic yttrium hydride layer is obtained by controlling a concentration of oxygen or a concentration of oxygen combined with the hydrogen concentration in the at least one photochromic yttrium hydride layer.

3. The method according to claim 1, wherein the at least one photochromic yttrium hydride layer is doped with any number of elements having a concentration smaller than a concentration of yttrium.

4. The method according to claim 1, wherein the essentially-hydrogen-impermeable transparent substrate is essentially impermeable to at least one of oxygen and water.

5. The method according to claim 1, wherein the transparent capping layer is essentially impermeable to at least one of oxygen and water.

6. The method according to claim 1, wherein the transparent capping layer acts as a diffusion barrier to reactive gases.

7. The method according to claim 1, wherein the essentially-hydrogen-impermeable transparent substrate is provided with a transparent or partially transparent layer impermeable to at least one of hydrogen, oxygen, and water fabricated between the at least one photochromic yttrium hydride layer and the essentially-hydrogen-impermeable transparent substrate.

8. The method according to claim 1, wherein the transparent capping layer is constituted by a hydrogen-impermeable transparent or partially transparent material enclosing photochromic yttrium hydride segments or particles being embedded therein, the at least one photochromic yttrium hydride layer thus being embedded in the hydrogen-impermeable transparent or partially transparent layer.

9. The method according to claim 1, wherein the transparent capping layer acts as an anti-reflection coating.

10. The method according to claim 1, wherein the transparent capping layer comprises at least one of silicon oxide, titanium oxide, yttrium oxide, aluminum oxide, silicon nitride, and aluminum nitride.

11. A photochromic metal hydride device having a variable transparency, the photochromic metal hydride device produced by the method of claim 1 and comprising:
   the essentially-hydrogen-impermeable transparent substrate, the at least one photochromic yttrium hydride layer, and the transparent capping layer, the at least one photochromic yttrium hydride layer having the band gap in the range from 1 eV to 4 eV without illumination, and the transparent capping layer at least partially positioned on the opposite side of the at least one photochromic yttrium hydride layer from the essentially-hydrogen-impermeable transparent substrate, the transparent capping layer being impermeable to hydrogen so as to maintain the concentration of hydrogen in the at least one photochromic yttrium hydride layer;
   wherein the thickness of the at least one photochromic yttrium hydride layer is in the range of 100-1500 nm;
   wherein the essentially-hydrogen-impermeable transparent substrate is the glass or polymer substrate;
   wherein the at least one photochromic yttrium hydride layer has the average oxygen concentration of approximately 30% to 65 at %;
   wherein the at least one photochromic yttrium hydride layer has the hydrogen concentration between 2 and 3 H per Y on the essentially-hydrogen-impermeable transparent substrate;
   wherein the transparent capping layer comprises the at least one of a transition metal oxide, transition metal nitride, alkaline oxide, alkaline nitride, rare earth oxide, rare earth nitride, polymer and plastic; and
   wherein the transparent photochromic metal hydride device has the visual transparency in the clear state of greater than 50%.

* * * * *